(12) United States Patent
Price et al.

(10) Patent No.: US 12,369,404 B2
(45) Date of Patent: Jul. 22, 2025

(54) ELECTRONIC CIRCUITS AND THEIR METHODS OF MANUFACTURE

(71) Applicant: PRAGMATIC SEMICONDUCTOR LIMITED, Cambridge (GB)

(72) Inventors: Richard Price, Sedgefield (GB); Brian Cobb, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 0 days.

(21) Appl. No.: 17/769,381

(22) PCT Filed: Oct. 22, 2020

(86) PCT No.: PCT/GB2020/052672
§ 371 (c)(1),
(2) Date: Apr. 15, 2022

(87) PCT Pub. No.: WO2021/079131
PCT Pub. Date: Apr. 29, 2021

(65) Prior Publication Data
US 2023/0238377 A1   Jul. 27, 2023

(30) Foreign Application Priority Data
Oct. 22, 2019   (GB) ..................................... 1915263

(51) Int. Cl.
*H10D 86/80* (2025.01)
*H01C 7/00* (2006.01)
(Continued)

(52) U.S. Cl.
CPC ............. *H10D 86/85* (2025.01); *H01C 7/006* (2013.01); *H10D 84/209* (2025.01); *H10D 86/481* (2025.01); *H10D 86/80* (2025.01)

(58) Field of Classification Search
CPC ......... H01L 27/01; H01L 27/13; H01L 28/20; H01L 27/0802; H01C 7/006; H10D 86/85; H10D 86/80; H10D 84/209; H10D 86/481
See application file for complete search history.

(56) References Cited

U.S. PATENT DOCUMENTS 4,411,708 A   10/1983   Winhan
4,695,853 A    9/1987   Hackleman et al.
(Continued)

FOREIGN PATENT DOCUMENTS

EP   1494514 A2   1/2005
JP   2005-116773 A   4/2005

OTHER PUBLICATIONS

Invitation to Pay Additional Fees and, Where Applicable, Protest Fee for International Application No. PCT/GB2020/052672, mailed Jan. 25, 2021.
(Continued)

*Primary Examiner* — Jeff W Natalini
*Assistant Examiner* — Brandon C Fox
(74) *Attorney, Agent, or Firm* — Jason H. Vick; Amped IP LLC

(57) ABSTRACT

An electronic circuit comprises a first resistor (1) and a second resistor (2). The first resistor comprises: a first sheet (10) of resistive material; and a first pair (11, 12) of conductive contacts, each arranged in electrical contact with the first sheet, and arranged such that a shortest resistive path in the first sheet between the first pair of contacts passes through the first sheet and has a length equal to a thickness (L1) of the first sheet. The second resistor comprises: a second sheet (20) of resistive material; and a second pair (21, 22) of conductive contacts, each arranged in electrical contact with the second sheet, and arranged such that a shortest resistive path (L2) in the second sheet between the
(Continued)

second pair of contacts passes along at least a portion of a length of the second sheet.

25 Claims, 8 Drawing Sheets

(51) Int. Cl.
   *H10D 84/00* (2025.01)
   *H10D 86/40* (2025.01)
   *H10D 86/85* (2025.01)

(56) References Cited

U.S. PATENT DOCUMENTS

| | | | | |
|---|---|---|---|---|
| 6,297,556 | B1* | 10/2001 | Heger | H01C 7/006 |
| | | | | 257/536 |
| 6,542,379 | B1* | 4/2003 | Lauffer | H01F 41/041 |
| | | | | 428/209 |
| 2001/0045618 | A1* | 11/2001 | Trivedi | H01L 28/20 |
| | | | | 257/E27.101 |
| 2002/0125985 | A1* | 9/2002 | Tsukada | H01C 7/003 |
| | | | | 338/195 |
| 2004/0201941 | A1 | 10/2004 | Harris et al. | |
| 2005/0000728 | A1 | 1/2005 | Tanaka | |
| 2005/0151127 | A1 | 7/2005 | Iwata et al. | |
| 2006/0174477 | A1* | 8/2006 | Tanaka | H05K 1/167 |
| | | | | 29/846 |
| 2009/0002120 | A1* | 1/2009 | Molin | H01C 10/14 |
| | | | | 338/195 |
| 2010/0165525 | A1 | 7/2010 | Fjelstad et al. | |
| 2019/0139754 | A1 | 5/2019 | Hsueh et al. | |
| 2020/0203536 | A1* | 6/2020 | Karino | H01L 23/585 |
| 2020/0395151 | A1* | 12/2020 | Karino | H01C 1/142 |

OTHER PUBLICATIONS

International Search Report for International Application No. PCT/GB2020/052672, mailed Mar. 18, 2021.
Written Opinion for International Application No. PCT/GB2020/052672, mailed Mar. 18, 2021.
Combined Search and Examination Report Under Sections 17 and 18(3) for Great Britain Application No. 1915263.6, mailed Apr. 15, 2020.
Examination Report Under Section 18(3) for Great Britain Application No. 1915263.6, mailed Feb. 1, 2022.
Examination Report Under Section 18(3) for Great Britain Application No. 1915263.6, mailed Aug. 16, 2022.
International Preliminary Report on Patentability for International Application No. PCT/GB2020/052672, mailed May 5, 2022.

* cited by examiner

Oscillator

Logic gate

Voltage divider

ELECTRONIC CIRCUITS AND THEIR METHODS OF MANUFACTURE

CROSS-REFERENCE TO RELATED APPLICATIONS

This application is a national stage application under 35 U.S.C. 371 of PCT Application No. PCT/GB2020/052672 having an international filing date of 22 Oct. 2020, which designated the United States, which PCT application claimed the benefit of Great Britain Application No. 1915263.6, filed 22 Oct. 2019, each of which are incorporated herein by reference in their entirety.

FIELD OF THE INVENTION

The present invention relates to electronic circuits and/or electronic circuit modules comprising first and second resistors, and two methods of manufacturing such circuits/circuit modules.

BACKGROUND TO THE INVENTION

Many semiconductor technologies permit the inclusion of resistors in integrated circuits (ICs). For example resistors may be provided in a polysilicon gate layer, or in diffusion or well structures in a semiconductor (e.g. Si) substrate, or in thin film layers of metal or polysilicon in the 'back end of line' (BEOL) layers above active devices. A resistor type such as one of these can practically only provide a limited range of resistances, as will now be explained: Since the resistor is usually planar in form it is conventional to describe its resistivity in terms of sheet resistance, or resistance per square ($\Omega/\square$). Typical values are between 10 and 150$\Omega/\square$, and a resistor having a particular resistance is formed by choosing its width and length in this sheet material. The constraints of patterning resolution, resistor film thickness range, resistance tolerances, and limited available IC area result in a compromise in the range of resistors that can be provided in an IC. This may constrain circuit designs, for example by excluding IC designs of economically viable footprint that incorporate both resistances of the order hundreds of ohms (~$10^2 \Omega$) and resistances of the order millions of ohms (~$10^6 \Omega$, or M$\Omega$).

It is therefore an object of certain embodiments of the present invention to address one or more of the problems associated with the prior art.

SUMMARY OF THE INVENTION

An aspect of the present invention provides an electronic circuit (or circuit module) comprising a first resistor and a second resistor, the first resistor comprising:
a first sheet (e.g. layer or film) of resistive (i.e. electrically resistive) material; and
a first pair of conductive contacts, each arranged in electrical contact with the first sheet, and arranged such that a shortest resistive path in the first sheet between the first pair of contacts passes through the first sheet and has a length equal to a thickness of the first sheet,
and the second resistor comprising:
a second sheet (e.g. layer or film) of resistive material; and
a second pair of conductive contacts, each arranged in electrical contact with the second sheet, and arranged such that a shortest resistive path in the second sheet between the second pair of contacts passes along at least a portion of a length of the second sheet.

In certain embodiments, the first sheet comprises a first quantity of a first resistive material and the second sheet comprises a second quantity of said first resistive material.

In certain embodiments, each of the first and second sheets has the same substantially uniform thickness.

In certain embodiments, the first and second sheets are respective portions of a single sheet formed and then patterned during manufacture of the electronic circuit.

In certain embodiments, a first contact of the first pair is arranged in contact with at least a portion of a first surface (e.g. underside) of the first sheet, and a second contact of the first pair is arranged in contact with at least a portion of a second surface (e.g. upper surface) of the first sheet.

In certain embodiments, the circuit/module further comprises a substrate arranged to support the first and second resistors.

In certain embodiments, the substrate comprises an electrically insulating layer having a nominal underside and a nominal upper side.

In certain embodiments, a first contact of the first pair is formed on said underside, the electrically insulating layer comprises a window extending from the upper side through to the underside and enabling electrical contact of the first sheet to at least a portion of an upper surface of the first contact of the first pair, at least part of the first sheet being formed inside the window and in contact with the first contact, and a second contact of the first pair being formed at least partially over an upper surface of the first sheet.

In certain embodiments, the first sheet overlaps at least a portion of the nominal upper side surrounding said window.

In certain embodiments, the second contact of the first pair covers a portion, but not all, of the upper surface of the first sheet.

In certain embodiments, the second contact of the first pair covers the entire upper surface of the first sheet.

In certain embodiments, the second contact of the first pair extends beyond at least one edge of the first sheet so as to cover, and be in direct contact with, at least a portion of said upper side.

In certain embodiments, a first contact of the first pair is formed on said upper side.

In certain embodiments, said first sheet is formed over the first contact of the first pair and covers a portion, but not all, of the first contact.

In certain embodiments, said first sheet is formed over the first contact of the first pair and entirely covers the first contact.

In certain embodiments, the first sheet extends beyond at least one edge of the first contact of the first pair so as to cover, and be in direct contact with, a portion of said upper side.

In certain embodiments, a second contact of the first pair is formed over the first sheet so as to cover at least a portion of the first sheet.

In certain embodiments, the second contact covers a portion, but not all, of the first sheet.

In certain embodiments, the second contact entirely covers the first sheet.

In certain embodiments, the second contact extends beyond at least one edge of the first sheet so as to cover, and be in direct contact with, a portion of said upper side.

In certain embodiments, the second sheet is formed directly on said upper side.

In certain embodiments, a first contact of the second pair is formed over the second sheet so as to cover a first portion of the second sheet.

In certain embodiments, the first contact of the second pair extends beyond an edge of the second sheet so as to cover, and be in direct contact with, a portion of said upper side.

In certain embodiments, a second contact of the second pair is formed over the second sheet so as to cover a second portion of the second sheet.

In certain embodiments, the second contact of the second pair extends beyond an edge of the second sheet so as to cover, and be in direct contact with, a portion of said upper side.

In certain embodiments, a first contact of the second pair is formed directly on said upper side.

In certain embodiments, said second sheet is formed over the first contact of the second pair so as to at least partially cover the first contact of the second pair and to cover and be in direct contact with a portion of the upper side adjacent the first contact of the second pair.

In certain embodiments, a second contact of the second pair is formed directly on said upper surface, and said second sheet is formed over the second contact of the second pair so as to at least partially cover the second contact of the second pair.

In certain embodiments, a second contact of the second pair is formed over the second sheet so as to cover a second portion of the second sheet.

In certain embodiments, the second contact of the second pair extends beyond an edge of the second sheet so as to cover, and be in direct contact with, a portion of said upper side.

In certain embodiments, the first and second sheets have the same sheet resistance.

In certain embodiments, the first sheet has a first sheet resistance and the second sheet has a second sheet resistance, different from said first sheet resistance.

In certain embodiments, the circuit/module further comprises at least one of: a transistor; a voltage divider; a biasing network (e.g. low power dissipation biasing network); and an oscillator circuit (e.g. low frequency), and wherein the second resistor is arranged as one of: a load resistor between a terminal of said transistor and a voltage rail; a resistor of the voltage divider or biasing network; and a component of the oscillator circuit.

In certain embodiments, the circuit/module further comprises at least one of: a logic gate; and an oscillator circuit (e.g. low frequency), and the first resistor is arranged as one of: a component of the logic gate (e.g. as a pull-up or pull-down resistor); and a component of the oscillator circuit.

In certain embodiments, the circuit is an integrated circuit.

Another aspect of the invention provides a method of manufacturing an electronic circuit comprising a first resistor and a second resistor, the method comprising:

forming a first sheet (e.g. layer or film) of resistive (i.e. electrically resistive) material;

forming a first pair of conductive contacts, each arranged in electrical contact with the first sheet, and arranged such that a shortest resistive path in the first sheet between the first pair of contacts passes through the first sheet and has a length equal to a thickness of the first sheet;

forming a second sheet (e.g. layer or film) of resistive material; and forming a second pair of conductive contacts, each arranged in electrical contact with the second sheet, and arranged such that a shortest resistive path in the second sheet between the second pair of contacts passes along at least a portion of a length of the second sheet, whereby the first sheet and first pair of contacts form the first resistor and the second sheet and second pair of contacts form the second resistor.

In certain embodiments, said forming of the first and second sheets comprises:

forming a single sheet of resistive material;

patterning said single sheet to form said first and second sheets, said first sheet being a first portion of said single sheet and said second sheet being a second portion of said single sheet.

In certain embodiments, the method comprises:

forming a first contact of the first pair;

forming said single sheet of resistive material over the first contact of the first pair; pattering said single sheet to form said first and second sheets;

forming a single sheet of conductive material over the first and second sheets; and patterning the single sheet of conductive material to form a second contact of the first pair and first and second contacts of the second pair.

In certain embodiments, the method comprises:

forming a first single sheet of conductive material;

patterning the first single sheet of conductive material to form a first contact of the first pair and a first contact of the second pair;

forming said single sheet of resistive material over said first contacts;

pattering said single sheet of resistive material to form said first and second sheets;

forming a second single sheet of conductive material over the first and second sheets; and patterning the second single sheet of conductive material to form a second contact of the first pair and a second contact of the second pair.

In certain embodiments, the method comprises:

forming a first single sheet of conductive material;

patterning the first single sheet of conductive material to form a first contact of the first pair and first and second contacts of the second pair;

forming said single sheet of resistive material over said first contact of the first pair and the first and second contacts of the second pair;

pattering said single sheet of resistive material to form said first and second sheets; and forming a second contact of the first pair over the first sheet.

In certain embodiments, the method further comprises processing or doping at least a portion of at least one of the first and second sheets to alter its sheet resistance.

It will be appreciated that each of the above-mentioned patterning steps may be achieved by one or more of a variety of techniques, including lithography (e.g. involving formation of a resist layer over the layer to be patterned, selective exposure, by masking or otherwise, of portions of the resist layer to electromagnetic radiation, removal of resist material to expose portions of the layer to be patterned, and patterning of the layer by etching or otherwise) and imprinting (e.g. nano-imprinting) of a resist layer to form a pattern of depressions, removal of resist material to expose selected portions, under the initial depressions, of the layer to be patterned, and then patterning of the layer by etching or otherwise.

The patterning of the single sheet of resistive material and/or the single sheet(s) of conductive material in certain embodiments are subtractive techniques, involving removal of material after formation (e.g. by deposition) of a uniform layer (sheet), for example over the whole substrate/underlying structure.

In certain embodiments, each of the first and second sheets of resistive material is in the form of a thin film. Each thin film may, for example, have a thickness in the range 3 nm to 1000 nm, e.g. 3, 4, 5, 6, 7, 8, 9, 10, 20, 30, 40, 50, 100, 150, 200, 300, 400, or 500 nm. The thickness may be in the range 5-100 nm, or 10-50 nm for example.

Another aspect of the invention provides an electronic circuit (e.g. an integrated circuit) comprising a field effect transistor (FET) and a first resistor, the first resistor comprising a first sheet of resistive material, having a first side and a second side, and a first terminal in contact with the first side and a second terminal in contact with the second side, such that the first and second terminals are separated by a thickness of the first sheet, wherein said second terminal is also a gate terminal of the FET, the FET further comprising a body (e.g. sheet) of semiconductive material, a source terminal connected to the body of semiconductive material, a drain terminal connected to the body of semiconductive material, and a body (e.g. sheet) of dielectric material separating the body of semiconductive material (and in certain embodiments the source and drain terminals) from the gate terminal.

In certain embodiments the circuit further comprises a second resistor comprising a second sheet of resistive material and a second pair of terminals connected to the second sheet of resistive material and being separated by at least a portion of a length of the second sheet.

In certain embodiments, the first and second sheets of resistive material have been formed at the same time, and comprise respective portions of a single sheet of resistive material deposited, or otherwise formed, an then patterned. The first and second sheets may thus have the same thickness as each other, and may be formed from the same resistive material.

Again, in certain embodiments, each of the first and second sheets of resistive material is in the form of a thin film, which may have a thickness in the range 3 nm to 1000 nm, e.g. 3, 4, 5, 6, 7, 8, 9, 10, 20, 30, 40, 50, 100, 150, 200, 300, 400, or 500 nm. The thickness may be in the range 5-100 nm, or 10-50 nm for example.

In certain embodiments the body of semiconductive material is in the form of a thin film, which may have a thickness in the range 3 nm to 1000 nm, e.g. 3, 4, 5, 6, 7, 8, 9, 10, 20, 30, 40, 50, 100, 150, 200, 300, 400, or 500 nm. The thickness may be in the range 5-100 nm, or 10-50 nm for example.

In certain embodiments, the second resistor comprises a third conductive terminal (which may also be described as a control terminal) electrically isolated from the second sheet of resistive material and from the second pair of contacts, and to which a potential (voltage) may be applied to generate an electric field in at least a portion of the second sheet of resistive material.

In certain embodiments, the second resistor comprises a second body (e.g. layer/sheet) of dielectric material arranged to separate the second sheet of resistive material from the third conductive terminal.

In certain embodiments, the third conductive terminal is arranged between the second pair of contacts.

Another aspect provides an electronic circuit (e.g. an integrated circuit) comprising a field effect transistor (FET) and a first resistor, the first resistor comprising a first sheet of resistive material, having a first side and a second side, and a first terminal in contact with the first side and a second terminal in contact with the second side, such that the first and second terminals are separated by a thickness of the first sheet, the FET comprising a gate terminal, a body (e.g. sheet) of semiconductive material, a source terminal connected to the body of semiconductive material, a drain terminal connected to the body of semiconductive material, and a body (e.g. sheet) of dielectric material separating the body of semiconductive material from the gate terminal.

In certain embodiments, the body of dielectric material is provided by an insulative substrate. The first terminal of the first resistor and the gate terminal may, for example, both be formed on a nominal underside of the substrate (and may, for example, be formed by patterning a single sheet of conductive material), the first sheet of resistive material may be formed at least partially inside a window extending through the substrate to the first terminal.

It will be appreciated from the above summary, and from the following detailed description, that certain aspects and embodiments of the invention provide structures and processes/methods that allow thin film resistors to provide a greatly extended range of resistance in an IC, without an unduly adverse impact on IC footprint (size). An essence of certain embodiments is the provision of both planar, or horizontal, and through-film, or vertical, resistor geometries.

BRIEF DESCRIPTION OF DRAWINGS

Embodiments of the invention will now be described with reference to the accompanying drawings, of which.

DETAILED DESCRIPTION OF EMBODIMENTS OF THE INVENTION

Figure 1:
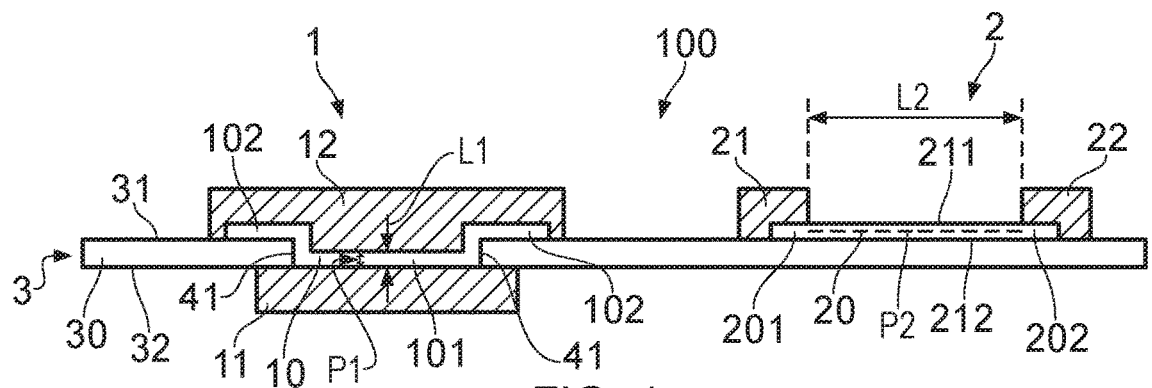
FIG. 1 is a schematic representation of part of an electronic circuit embodying the invention and comprising first and second resistors.

Referring now to FIG. 1, this shows, in schematic form part of an electronic circuit embodying the invention, and which may also be described as a circuit module. The electronic circuit comprises a first resistor 1 and a second resistor 2, each supported by a substrate or supporting structure 3, which in this example is in the form of a sheet, layer, or other body of electrically insulating material (dielectric) 30. The substrate has a nominal upper side or surface 31, and a nominal lower side or surface 32. Although the substrate in this example comprises a single insulating layer 30, in other examples the substrate may have additional structure. For example, it may comprise a plurality of layers.

In the figure, although the first and second resistors 1, 2 are shown next to each other, it will be appreciated that in alternative embodiments the two resistors may be spaced apart, as required, typically among a plurality of other electronic components and circuit elements.

The first resistor 1 comprises a first sheet 10 (e.g. layer or film) of resistive (i.e. electrically resistive) material, and a first pair of conductive contacts 11, 12, each arranged in electrical contact with the first sheet, and arranged such that a shortest resistive path (labelled P1) in the first sheet 10 between the first pair of contacts 11, 12 passes through the first sheet and has a length L1 equal to a thickness of the first sheet.

The second resistor 2 comprises a second sheet 20 (e.g. layer or film) of resistive material, and a second pair of conductive contacts 21, 22, each arranged in electrical contact with the second sheet, and arranged such that a shortest resistive path P2 in the second sheet between the second pair of contacts passes along at least a portion of a length of the second sheet. In this example, the length L2 of the shortest resistive path P2 in the second sheet 20 between the contacts 21, 22 of the second pair is equal to the lateral separation of the contacts 21,22 in the plane parallel to the upper surface 31 of the substrate. In contrast, the length L1 of the shortest resistive path P1 between the contacts 11, 12 of the first resistor is equal to the minimum "vertical" separation between the contacts 11, 12.

In this example, the first sheet 10 comprises a first quantity of a first resistive material, the second sheet 20 comprises a second quantity of that same resistive material, and each of the first and second sheets has the same, substantially uniform, thickness. In other embodiments, however, the two sheets 10, 20 may be formed from different resistive materials (e.g. having different sheet resistances) and/or the two sheets 10, 20 may have different thicknesses.

A first (lower) contact 11 of the first pair is arranged in contact with a portion of a first surface (a nominal underside) of the first sheet 10, and a second contact 12 of the first pair is arranged in contact with a second surface (a nominal upper surface) of the first sheet.

In this example, the first contact 11 of the first pair is formed on a nominal underside 32 of the substrate 3, and the substrate comprises a window extending from the upper side 31 through to the underside 32. This window, whose sidewall is labelled 41, enables electrical contact of the first sheet 10 to a portion of a surface (a nominal an upper surface) of the first contact 11 of the first pair. A part (portion) 101 of the first sheet 10 is formed inside the window and is in contact with the first contact 11. The second contact 12 is formed over a nominal upper surface of the first sheet, and in this example covers the first sheet entirely and extends so as to be in direct contact with, and cover, portions of the upper surface 31 of the substrate. In addition to the portion 101 inside the window, the first sheet also comprises a portion (or portions) 102 covering a portion of the upper surface 31 surrounding the window. The second (upper) contact 12 covers these portions 102 as well.

In this example, the second sheet 20 is formed directly on the upper side/surface 31 of the substrate, and a first contact 21 of the second pair is formed over the second sheet (partially overlapping an upper surface 211 of the second sheet, a lower surface 212 of the second sheet being in contact with the upper substrate surface 31) so as to cover a first portion 201 of the second sheet. The first contact 21 extends beyond an edge of the second sheet 20 so as to cover, and be in direct contact with, a portion of the upper substrate surface 31. The second contact 22 of the second pair is also formed over the second sheet in this example, so as to cover a second portion 202 of the second sheet, and also extends beyond an edge of the second sheet so as to cover, and be in direct contact with, a portion of said upper side.

It will be appreciated that the resistance of the first resistor 1 is almost entirely determined (i.e. is dominated) by the sheet resistance of the first sheet (i.e. the resistivity of the material forming its resistive body), the thickness of the first sheet 10, and the area of the portion 101 of the first sheet 10 sandwiched between respective portions of the contacts 11, 12 inside the window. The resistance of the second resistor 2 is almost entirely determined (i.e. is dominated) by the lateral separation of the contacts 21, 22 defining the length L2 of the resistive path P2, and the cross sectional area of the second sheet in a plane normal to the path P2 (i.e. the product of the thickness of the second sheet 20, and its width). By appropriate arrangement of these various parameters, the resistors (based on, in this example, the same resistive material in sheet form) can be arranged to have vastly different resistances, as required by the circuit(s) in which they are connected/incorporated.

Still referring to FIG. 1, it will be appreciated that the illustrated structure may be formed in an IC at a suitable location and orientation. Advantageously, the same resistive film may form both horizontal and lateral resistors 1, 2, e.g. they may both be patterned from a single blanket layer of resistive material. Similarly, the lateral resistor contacts and the upper contact of the vertical resistor may be patterned from a single blanket layer of conductive material, e.g. metal, on top of the resistive material.

Figure 10:
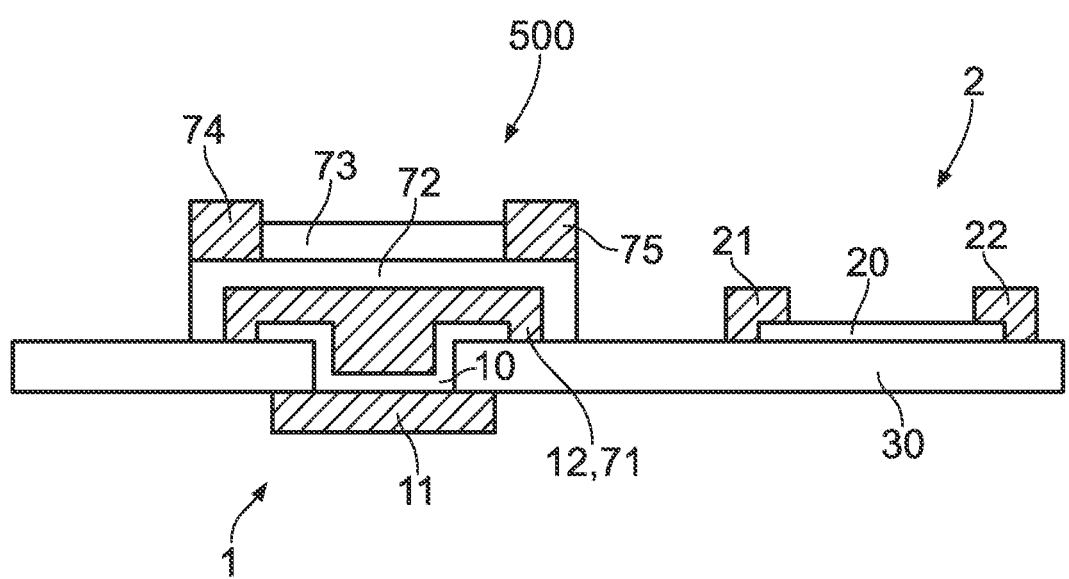
FIG. 10 illustrates part of another electronic circuit embodying the invention.

In one example implementation, the first resistor 1 structure may be integrated beneath a bottom gate TFT device 500 (as shown in FIG. 10). In other words, the upper contact 12 of the first resistor may also provide the gate terminal 71 of a bottom gate TFT device 500, with a dielectric layer 72 on top of the gate 71 and separating the gate from a semiconductor channel 73, having source 74 and drain 75 terminals also connected.

It will be appreciated that the first and/or second resistors may be placed below or above a base insulating layer, or other supporting substrate/structure. A requirement of such a base layer is that it is insulating and suitable for subsequent deposition of the layers above, e.g. it may need to be substantially free of pinholes, stable over a desired temperature range, have appropriate flexibility, etc.

Still referring to FIG. 1, it can be regarded as illustrating part of an IC stack structure embodying the invention. The lowermost layer of the structure is a conductive lower contact layer, which is patterned to provide the lower conducting contact 11 for a vertical resistor 1. Other features may be present in this layer, for example interconnects between other components and between the vertical resistor and such other components, and/or elements of other components such as transistors, diodes, capacitors, etc. Above the lower contact layer is an insulating layer 30, for example a dielectric. This layer may be formed from a thin film dielectric material, such as a metal oxide or a polymer. A window is patterned in the insulating layer, e.g. by subtractive or additive techniques, at least partially above the lower contact 11 for the vertical resistor 1. The thickness of the insulating layer may be chosen to provide any desired support, barrier, processing or other properties—it may not directly affect the resistance of the vertical resistor 1, however in some examples the insulating layer 30 may be designed to have an effect on the resistive material, for example by donating or accepting atoms to or from the resistive material. Above the insulating layer 30 is a layer of resistive material. This layer forms a thin resistive film 10 on top of the insulating layer and, in the window, on top of the lower contact 11. The resistive film may be composed of any suitable resistive material, e.g. metal oxide(s), metal(s), polymer(s), etc. The resistive film is patterned, by additive or subtractive methods, to form the resistive film 10, 20 for both the horizontal and vertical resistors 2, 1. Above the resistive film is a layer of conductive material. This layer forms the upper contact 12 for the vertical resistor 1, and both contacts 21, 22 for the horizontal resistor 2. Other features may be present in this conducting layer, as for the lower contact layer. These four layers, the lower contact layer, insulating layer, resistive film and upper contact layer, provide the structure of this embodiment. It may be integrated into any electronic circuit, in particular an integrated circuit. Conveniently it may be integrated into a thin film transistor (TFT)-based integrated circuit, for example as illustrated in FIG. 10.

Figure 2:
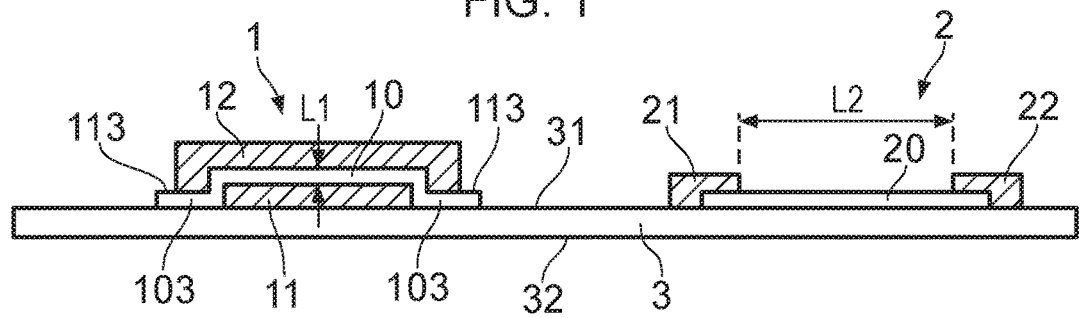
FIGS. 2-5 illustrate portions of further electronic circuits in accordance with alternative embodiments of the invention.

In an alternative approach, the insulating layer may be omitted from the structure, and the structure would then correspond to that shown in FIG. 2, but without the substrate 3. The three-layer structure could thus be provided on any suitable support or structure, having a surface such as surface 31 in FIG. 2.

In such a three layer structure (as illustrated in FIG. 2 but without the layer 3) the lower contact 11 of the vertical resistor 1 may be formed first, then the resistive film may be deposited and patterned to form both resistor elements 10, 20, then the upper contact 12 of the vertical resistor 1 and both contacts 21, 22 of the lateral resistor 2 may be deposited in a single layer of conducting material and patterned.

Furthermore, depending on the ordering of the manufacturing process, any of the structures (the vertical resistor 1 or the lateral resistor 2, in either the four layer structure or the three layer structure) may be inverted (e.g. horizontal resistor contacts and lower vertical resistor contact at the bottom, resistive film layer above, insulating layer (if present) above, and upper vertical resistor contact on top).

Thin film technologies typically provide relatively high aspect ratio structures. For example, whilst film deposition and patterning techniques provide minimum reliable in-plane feature sizes of around 500 nm, the film thickness may be reliably formed to a thickness of 10 nm or even less. It can be seen that, for a film of given thickness and resistivity, this enables the structure described above to efficiently provide a horizontal resistor of relatively high resistance and a vertical resistor of relatively low resistance. For example a film having resistivity $\rho$ and thickness 10 nm provides a 5 µm×5 µm horizontal resistor of $R=\rho \cdot l/A=\rho \cdot 5000/(5000 \times 10) = \rho/10 = 0.1\rho\Omega$, and a 5 µm×5 µm vertical resistor of $\rho \cdot 10/(5000 \times 5000) = \rho/2.5 \times 10^6 = 0.4 \times 10^{-6} \rho \Omega$. Hence for these example square resistors of identical planar area, there is approximately six orders of magnitude difference in resistance. The geometric parameters of the resistors may be tailored to provide resistors of the desired resistances wherever needed in the circuit, for example simply by design of the window (if present) and the patterning of the resistive material into sheets 10 and 20.

In certain embodiments, further measures may be taken to adjust the resistances of some or all of the lateral and/or vertical resistors. For example, one or more lateral resistors may be selectively annealed using a UV laser to adjust (e.g. reduce) the resistance of its resistive film. The resistive films of all vertical resistors may be protected by the contacts, which may be made from a metal that is opaque to UV radiation. Another example is thermal annealing, which may be applied to the whole IC at the point when the resistive film of the lateral resistor is not covered by a protective barrier or encapsulation layer above, rendering it more susceptible to effects such as oxidation than the wholly covered resistive film of the vertical resistor.

Referring now to FIG. 2, this illustrates another embodiment of the invention comprising a first, generally vertical resistor (1), and a second, generally lateral or horizontal resistor (2). In contrast to the embodiment shown in FIG. 1, in this second embodiment there is no window formed through the substrate (3). Instead, both the first and second resistors (1, 2) are formed on the same surface (in this example an upper surface (31)) of the supporting substrate or structure (3). The first contact (11) is formed directly on the substrate upper surface (31), and is entirely covered by the first sheet (10) of the first resistor, that first sheet (10) including portions 103 which overlap the edges of the first contact (11) and cover, and are in direct contact with, surrounding portions of the substrate upper surface (31). The second sheet (20) is formed directly on the substrate upper surface (31). The second contact (12) of the first resistor (1) is formed over the first sheet (10) but, in this example, does not cover the entire upper surface of the sheet (10), portions of which remain uncovered just outside the perimeter of the second electrode (12), these uncovered portions are labelled 113 in the figure. The structure of the second resistor (2) in this embodiment is generally the same as that in FIG. 1. Referring back to FIG. 1, it should be noted that in that embodiment the thicknesses of the contacts (which may also be referred to as electrodes) (12, 21, and 22) are substantially the same as each other, and those contacts may have been formed from portions of a common sheet of conductive material. Similarly, in the embodiment shown in FIG. 2, the thicknesses of the first contact (11) and the contacts (21 and 22) are substantially the same as one another, having been formed from a common sheet of material.

The thickness of the second contact (12) in this example is generally the same as the thickness of the first contact (11), although in other embodiments the thicknesses may differ.

Figure 3:
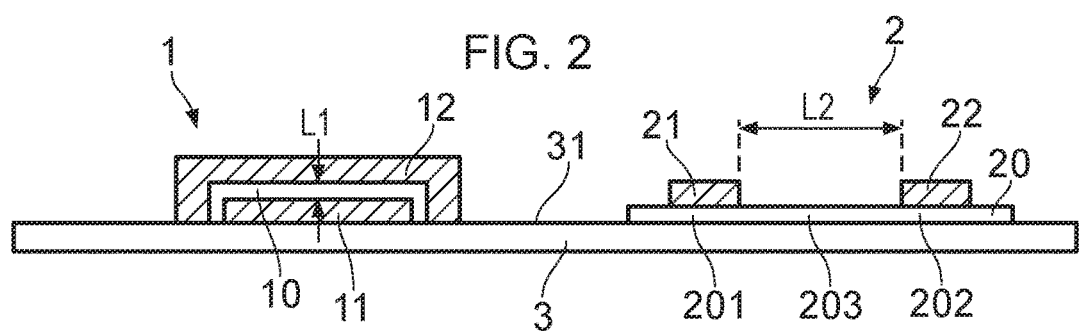

Referring now to FIG. 3, in this example the first contact (11) is again formed directly on an upper surface (31) of the substrate, as is the second sheet (20). Differences, however, are that in this example the second electrode (12) of the first resistor (1) completely covers an upper surface of the first sheet (10) and extends beyond the first sheet (10) so as to cover, and be in direct contact with, portions of the substrate upper surface (31) surrounding the first sheet (10). Also, the contacts (21 and 22) in this example do not overlap edges of the second sheet (20). These two contacts (21, 22) are each located on an upper surface of the second sheet (20), within its perimeter (i.e. spaced from its edges), with the contact (21) covering a first portion (201) of the sheet (20), and the second contact of the sheet (22) covering a second portion (202). The shortest path length, via the sheet (20), between the contacts (21 and 22) is again determined by the lateral separation of the contacts (21 and 22), indicated as L2 in the figure.

Figure 4:
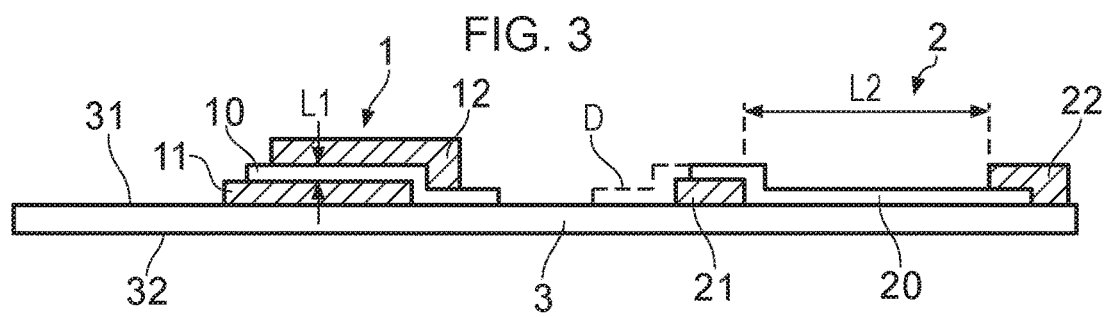

Referring now to FIG. 4, this shows yet another embodiment in which the first contact (11) of the first resistor (1) and the first contact (21) of the second resistor (2) have each been formed on respective portions of the substrate upper surface (31). The first sheet (10) has been formed over the first contact (11) so as to cover a portion of an upper surface of the contact (11) but also extend beyond an edge of that contact 11 and cover, and be in direct contact with, an adjacent portion of the substrate upper surface (31). Similarly, the second sheet (20) has been formed so as to at least partially overlap the first contact (21) on the second resistor (2), and so as to extend beyond an edge of that contact (21) to cover an extended portion of the substrate upper surface (31). To complete the first resistor, the second contact (12) has been formed to cover part of an upper surface of the first sheet (10), with a portion of the contact (12) overlapping the first contact (11) underneath the sheet (10). Thus, the shortest electrical path between the electrodes (11 and 12) via the sheet (10) again has length L1, corresponding to a thickness of the sheet (10). The resistance of the first resistor (1) is thus largely determined by the overlapping area between the first and second contacts (11, 12) and the thickness of the sheet (10). In contrast, the second contact (22) of the second resistor (2) is formed so as to not overlap the first contact (21), but instead be laterally separated from the first contact (21) by a distance L2. In this embodiment the second contact (22) extends beyond an edge of the second sheet (20) so as to again cover a portion of the substrate upper surface (31). Although the second sheet (20) in this example only partially overlaps the first contact (21), in alternative embodiments it may completely cover the first contact (21) and even extend so as to cover an adjacent portion of the substrate upper surface, as denoted by the broken line D in the figure.

Figure 5:
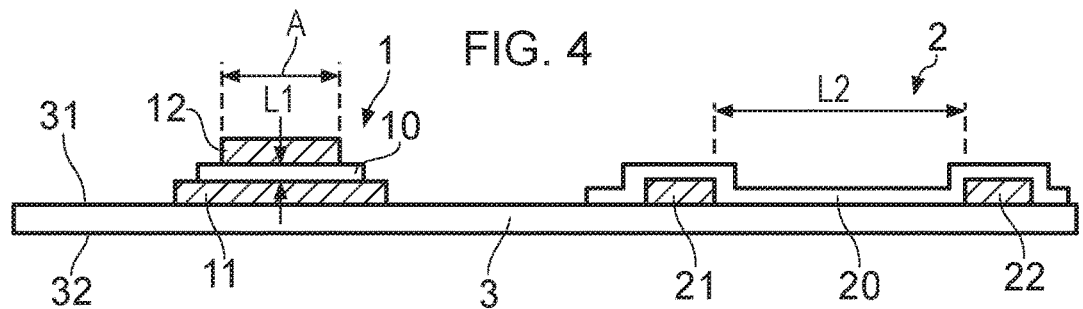
Figure 6A:
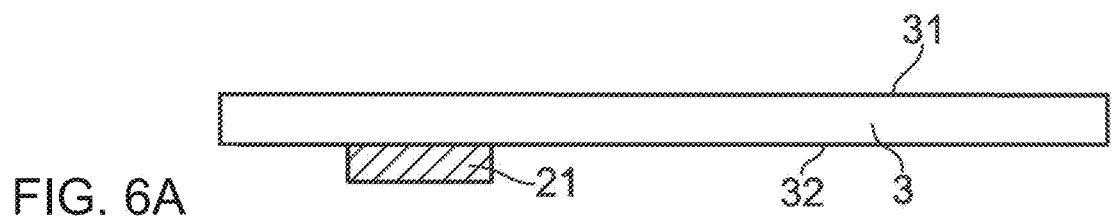
FIGS. 6A-6F, 7A-7E, 8A-8F, and 9A-9G illustrate steps in a number of manufacturing methods embodying an aspect of the invention.
Figure 6B:
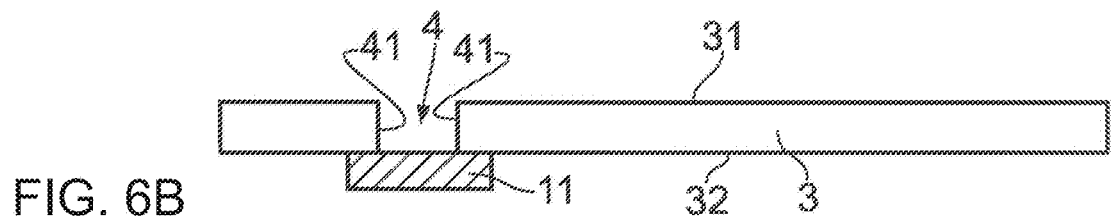
Figure 6C:
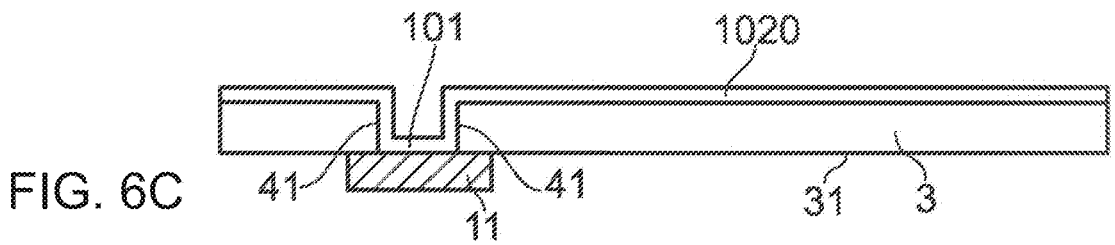
Figure 6D:
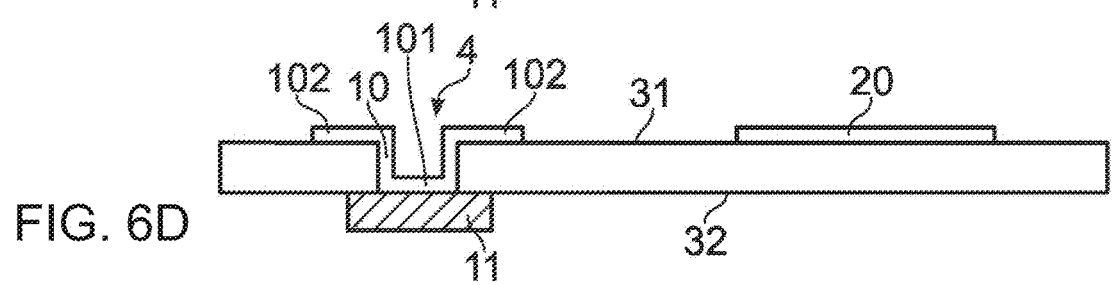
Figure 6E:
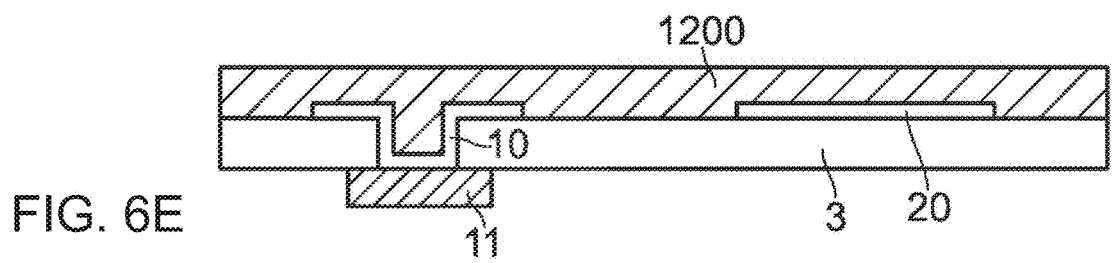
Figure 6F:
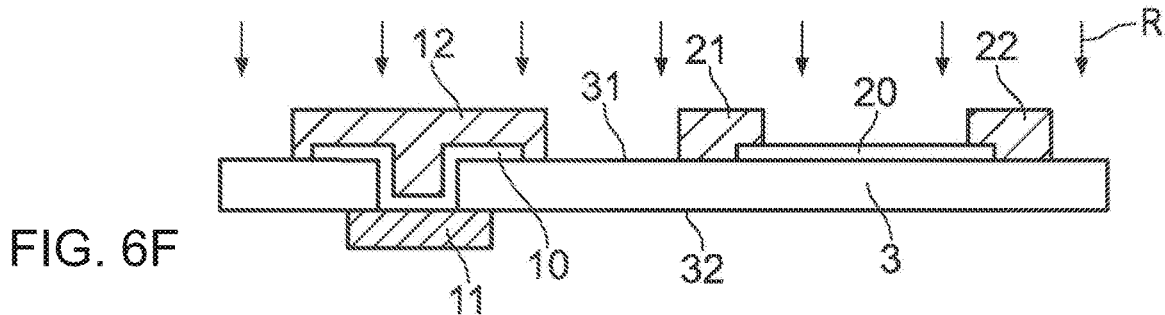
Figure 7A:
Figure 7B:
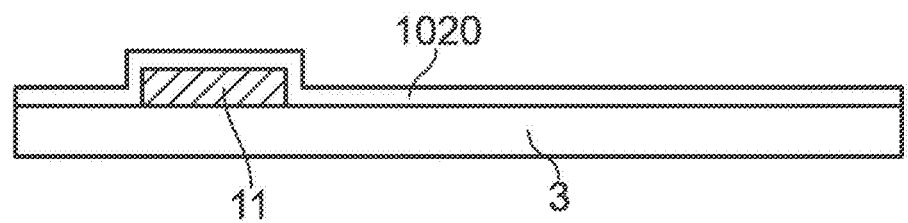
Figure 7C:
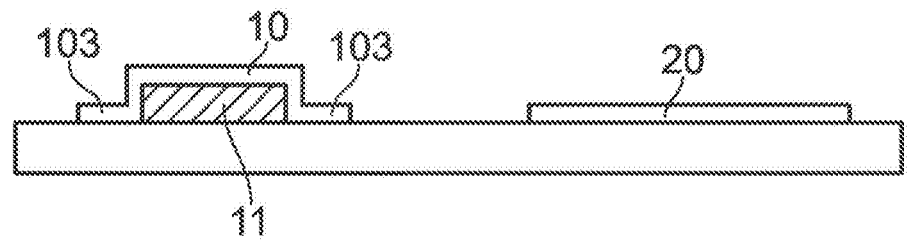
Figure 7D:
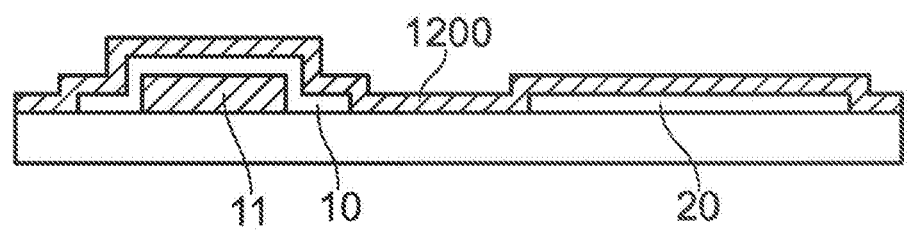
Figure 7E:
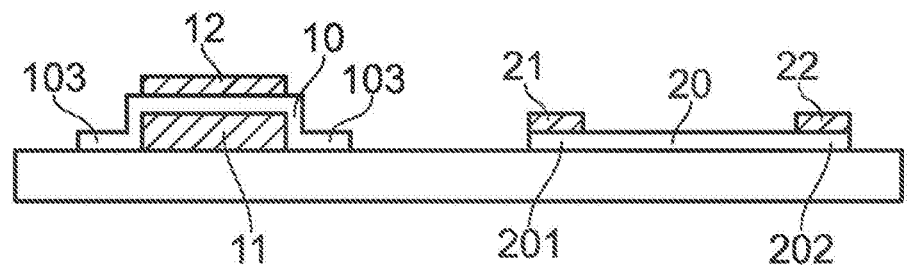
Figure 8A:
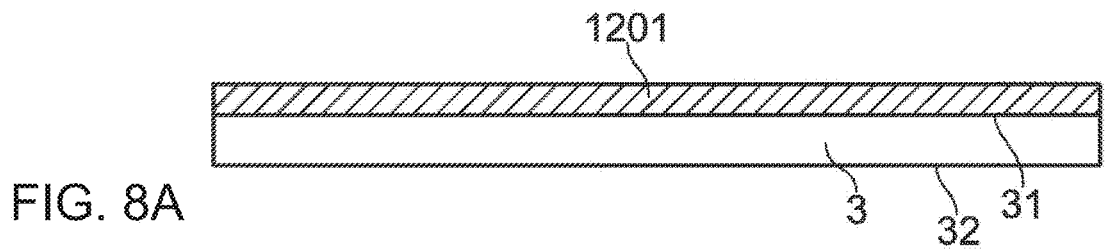
Figure 8B:
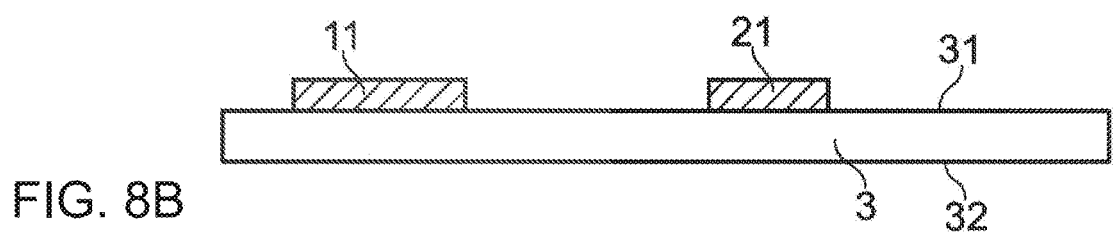
Figure 8C:
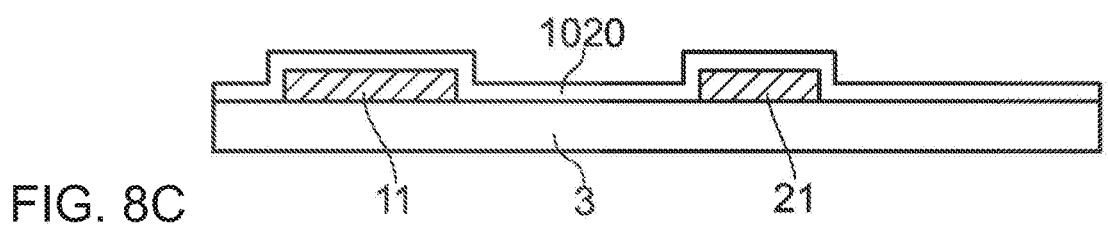
Figure 8D:
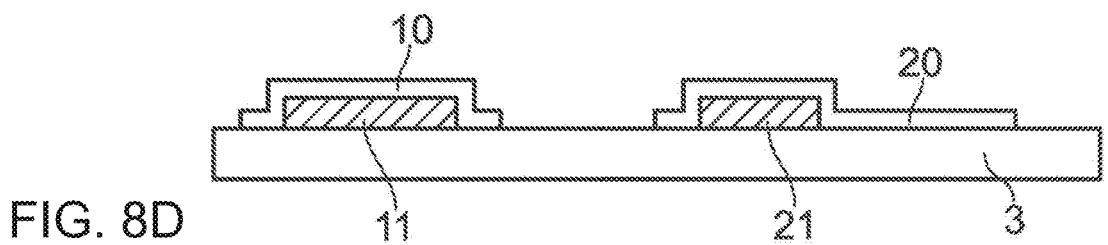
Figure 8E:
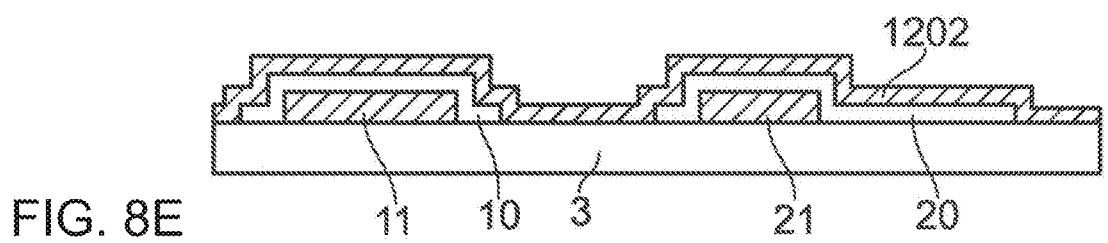
Figure 8F:
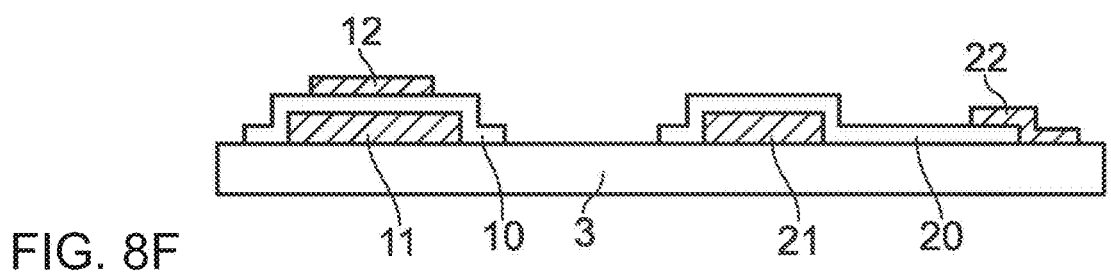
Figure 9A:
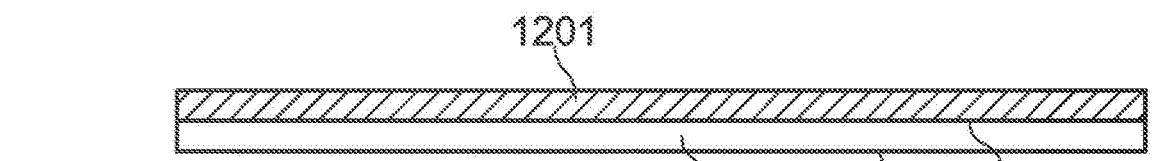
Figure 9B:
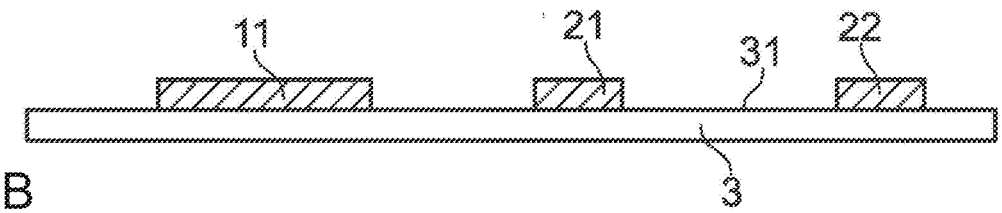
Figure 9C:
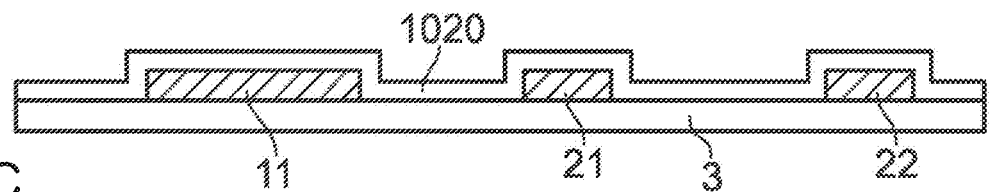
Figure 9D:
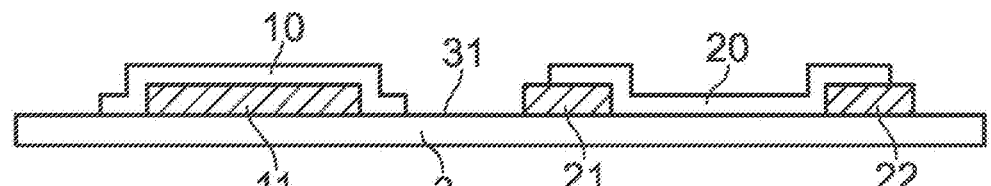
Figure 9E:
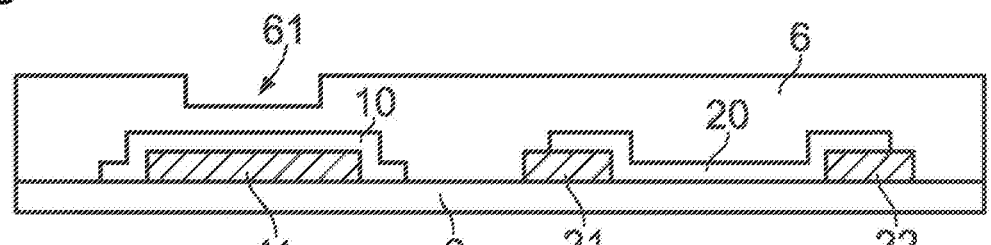
Figure 9F:
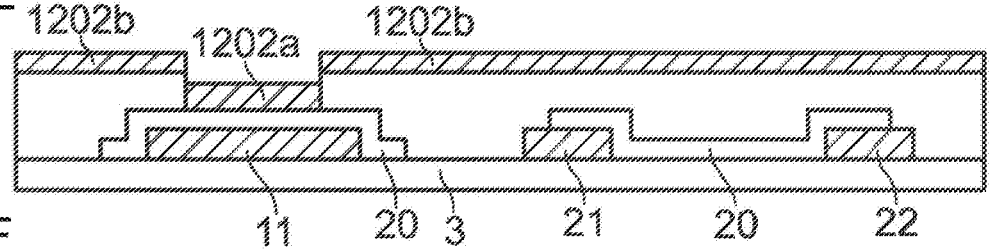
Figure 9G:
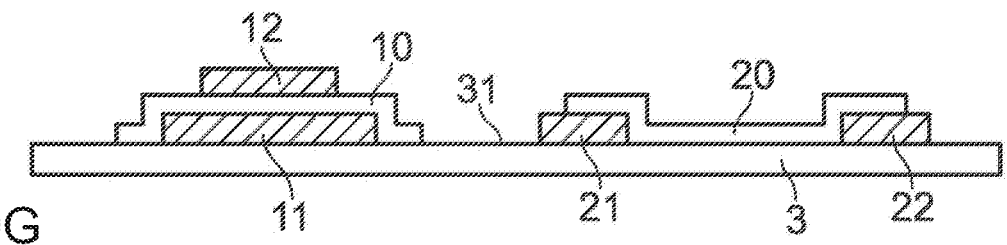

Referring now to FIG. 5, in this alternative embodiment the first resistor (1) has its first contact (11) formed directly on a portion of the substrate upper surface (31). The first sheet (10) is formed so as to cover just a portion of an upper surface of a first contact (11), and then the second contact (12) is formed so as to cover just a portion of an upper surface of the sheet (10). The resistance of the first resistor (1) is thus determined almost entirely by the area A of the upper contact (12) and the thickness of the first sheet (10) which defines the path length L1. In this example the second sheet (2) covers each of the electrodes (21, 22) entirely, and as well as covering a portion of the substrate upper surface (31) between those electrodes (21, 22), also extends so as to cover portions of the substrates surface (31) on the other sides of the electrodes.

In general the structures of any of the first resistors (1) in FIGS. 1-5 may be in the same integrated circuit, IC, as any of the structures of the second resistors (2) in FIGS. 1-5. Some combinations have particular advantages in their efficient manufacture. In other words, alternative embodiments may comprise any combination of a first resistor from any of the accompanying figures and a second resistor from any of the accompanying figures, and those two resistors may be comprised in a common IC.

Referring now to FIG. 6, this shows a method of producing an electronic circuit in accordance with an embodiment of the invention. As illustrated in FIG. 6A, a substrate (3) is provided having an upper surface (31) and a lower surface (32). A lower contact (21) is formed from conductive material by an appropriate technique. Then, as illustrated in FIG. 6B, a window (4) is formed through the substrate (3) so as to extend from the upper surface (31) down to the lower surface (32), and exposing a portion of the nominal upper surface of the contact (11). Next, as illustrated in FIG. 6C, a single layer (1020) of resistive material is formed over the structure illustrated in FIG. 6B, that layer (1020) covering portions of the upper surface (31) of the substrate (3) and also covering side walls (41) of the window and the exposed portion of the upper surface of contact (11) inside the window (4). Next, as illustrated in FIG. 6D, the layer (1020) is patterned by any suitable technique, so as to form the first sheet (10), and second sheet (20), each of which is thus provided by a respective portion of the original single sheet (1020). The first sheet (10) thus comprises a portion (101) inside the window which is in contact with the lower contact (11), and portions (102) which cover at least a portion of the upper substrate surrounding the window (4). The second sheet (20) covers a portion of the upper surface (31). As illustrated by FIG. 6E, a layer or other body of conductive material (1200) is formed over the structure of FIG. 6D. Then, as illustrated by FIG. 6F, that conductive layer (1200) is patterned by any suitable technique so as to define the upper contact (12) of the first resistor and the contacts (21 and 22) of the second resistor. In certain embodiments, the structure may then be subject to further processing, for example by exposure to electro-magnetic radiation R, to alter the sheet resistance of at least one of the first and second sheets (10, 20). In FIG. 6F, exposure to electro-magnetic radiation R is illustrated. The upper contact (12) of the first resistor may shield the first sheet (10) from the electro-magnetic radiation R, whereas the portion of the second sheet (20) between contacts (21 and 22) may be exposed to the radiation R. This selective radiation may be arranged so as to decrease the sheet resistance of the exposed portion of the second sheet (20), and enables adjustment or tuning of the resistance of the second resistor after that sheet has been formed. It will be appreciated that although the above example uses electro-magnetic radiation to alter sheet resistance other processing methods may be employed in alternative embodiments of the invention to achieve alteration sheet resistance of one or both of the first and second sheets (10, 20).

Referring now to FIG. 7, this illustrates another method embodying the invention. In this method, as illustrated in FIG. 7A, a substrate (3) is provided and a first contact (11) is formed on an upper surface (31). Then, as shown in FIG. 7B, a single layer of resistive material (1020) is formed over the structure of FIG. 7A, completely covering the first contact (11). Then, as shown in FIG. 7C, the resistive layer (1020) is patterned to form the first sheet (10), which completely covers and overlaps the first contact (11), and to form the second sheet (20) which is formed in direct contact with the upper surface (31). Next, as shown in FIG. 7D, a single layer of conductive material (1200) is formed over the structure shown in FIG. 7C, so as to completely cover the first and second sheets (10, 20), and portions of the upper surface (31). Next, as shown in FIG. 7E, the conductive sheet (1200) is patterned by any suitable technique so as to form the upper contact (12), which in this example has an extent exactly corresponding to the extent of the underlying lower electrode (11), and the first and second contacts (21, 22) of the second resistor. In this example, these contacts (21 and 22) are located at edge portions of the second sheet (20), but do not overlap those edges.

Referring now to FIG. 8, this illustrates another method embodying the invention. As shown in FIG. 8A, a substrate (3) is provided, together with a first layer of conductive material (1201) covering a region of an upper surface (31) of the substrate (3). Next, as shown in FIG. 8B, that first conductive layer is patterned so as to form the lower contact (11) of the first resistor and a first contact (21) of the second resistor. A layer of resistive material is then formed so as to completely cover the contacts (11 and 21), as shown in FIG. 8C. Then, as illustrated in FIG. 8D, the resistive layer (1020) is patterned to leave behind the first and second sheets (10,20). In this example the first sheet (10) completely covers the electrode (11), and the second sheet (20) entirely covers the electrode (21), as well as an adjacent portion of the upper surface (31) of the substrate (3). Next, as shown in FIG. 8E, a second layer of conductive material (1202) is formed over the structure from FIG. 8D, so as to completely cover the first and second sheets (10, 20). Then, as shown in FIG. 8F, that second conductive layer (1202) is patterned so as to form the upper contact (12) of the first resistor (1) and the second contact (22) of the second resistor (2).

Referring now to FIG. 9, this shows another method embodying the invention. Again, as illustrated in FIG. 9A a substrate (3) is provided and a first layer of conductive material (1201) is formed over at least a portion of the upper surface (31). That first conductive layer is then patterned, as shown in FIG. 9B, so as to form the lower electrode (11) of the first resistor, and the first and second electrodes (21, 22) of the second resistor. Then, a layer of resistive material (1020) is formed over the previously formed electrodes/contacts (as shown in FIG. 9C), and then that single layer (1020) is patterned to provide the first and second sheets (10, 20) as illustrated in FIG. 9D. The first sheet in this example completely covers the lower electrode (11), and the second sheet (20) covers just portions of the electrodes (21 and 22). Next, a layer of resist material (6) is formed over the structure from FIG. 9D, and a depression (61) is formed in an upper surface of the resist layer (6) by suitable means. That depression (61) is then developed and/or etched (i.e. material is removed at least from the base/bottom of the depression, by a suitable technique) so as to form a window through the resist layer down to the first sheet (10) so as to expose a portion of the upper surface of the sheet (10). Then, as illustrated in FIG. 9F, a second layer of conductive material is formed over the structure such that portions 1202B of the second conductive layer cover remaining portions of the resist material, and a further portion 1202A of the conductive layer covers part of the first sheet (10) upper surface inside the window. Then, the remaining resist material is removed by a suitable technique so as to leave the structure illustrated in FIG. 9G, where the conductive material that was formed inside the window now forms the upper contact (12) of the first resistor (1).

Referring again to FIG. 10, this illustrates another circuit embodying the present invention. The circuit is an integrated circuit, in which a thin film transistor 500 (having a thin film semiconductor channel 73) is integrated with at least a first thin film resistor 1. In this example, the circuit also integrates a second thin film resistor 2. The first resistor is a vertical resistor, with first and second contacts 11, 12, arranged on either side of a first sheet 10 or resistive material, and separated by that sheet's thickness. The second resistor is a lateral resistor, with its contacts 21 and 22 being separated by a portion of the length of a second sheet 20 of resistive material. In certain embodiments, the first and second sheets 10, 20 may be deposited at the same time, for example as respective portions of a single thin film of resistive material, which is then patterned to form the separate, distinct, first and second resistive sheets 10, 20. The first resistor 1 structure in this example is integrated beneath the transistor 500, which is a bottom gate TFT device. The upper contact 12 of the first resistor provides the gate terminal 71 of the bottom gate TFT device 500, with a dielectric layer 72 on top of the gate 71 and separating the gate from a semiconductor channel 73, having source 74 and drain 75 terminals also connected.

In alternative embodiments, rather than the first resistor being formed around (or at the location of) a window through a substrate, 30, the first resistor may have any of the other forms disclosed in this specification. It may still be integrated with an FET (e.g. a top or bottom gate TFT), with one of its contacts also providing (being) a gate terminal of the FET. The first resistor and FET may be integrated with the FET above the first resistor, or the first resistor above the FET.

Figure 11:
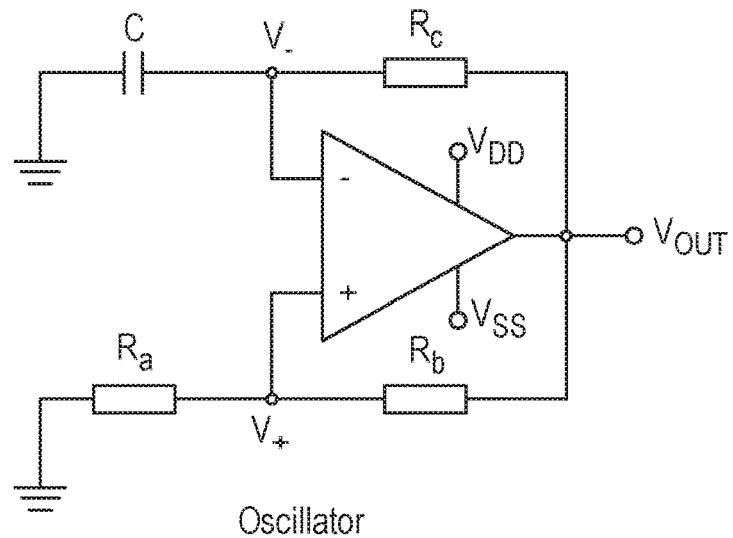
FIGS. 11 to 13 illustrate an oscillator circuit (or module), logic gate (or module), and voltage divider circuit (or module) respectively, each of which may embody, or be incorporated in embodiments of, the present invention.
Figure 12:
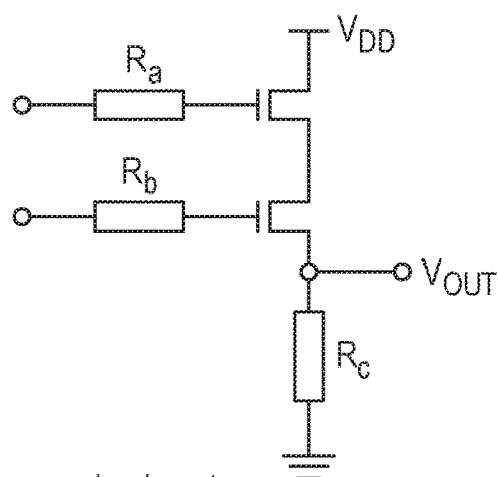
Figure 13:
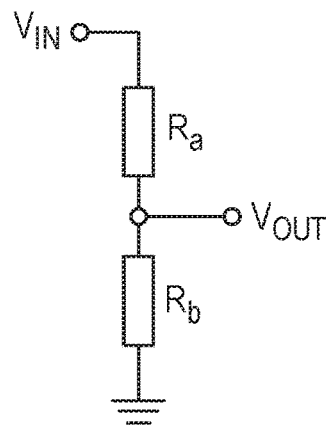

Referring now to FIGS. 11 to 13, these illustrate circuits or circuit modules which may incorporate one or more of the resistors described above. One or more of the resistors Ra, Rb, and Rc illustrated may each be provided by one of the first or second resistors as described above, to suit circuit requirements.

Figure 14:
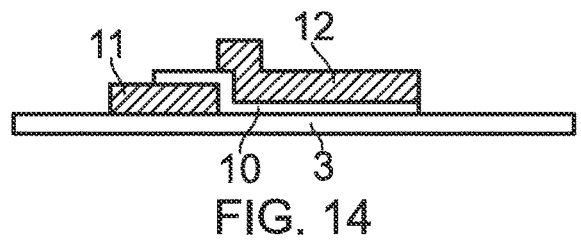
FIGS. 14 and 15 illustrate resistor configurations suitable for use in embodiments.
Figure 15:
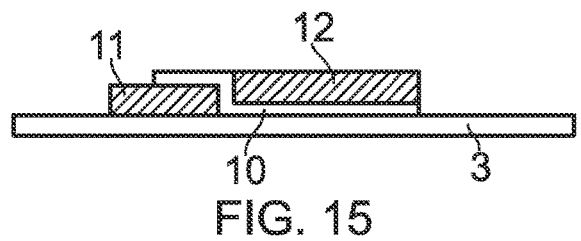

It will be appreciated that vertical resistors, with a large area of overlap in the horizontal plane, will in general have a high capacitance, and in certain applications this may be undesirable. FIGS. 14 and 15 illustrate resistor configurations which may be used in certain embodiments, and which may be described as hybrid vertical/lateral devices. In FIG. 14 and FIG. 15, each resistor has no overlap (in the horizontal plane) between the first and second contacts/terminals 11, 12, and it will be appreciated that the shortest resistive path between the contacts 11, 12 is still the thickness of the first sheet 10 of resistive material. There is, however, overlap between the contacts in the vertical plane, and the size of this overlap at least partly determines the resistance of each device, together of course with the thickness of the sheet 10 and its resistivity.

Figure 16:
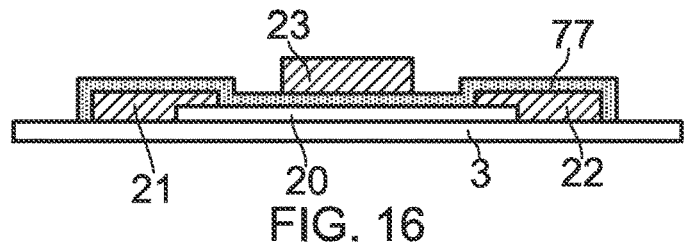
FIG. 16 illustrates a voltage controlled resistor embodying another aspect of the invention.

Referring now to FIG. 16, this illustrates a voltage-controlled resistor, embodying another aspect of the invention, and which may be incorporated in circuits embodying other aspects. In addition to the first and second contacts 21, 22, the resistor comprises a third terminal 23 which is electrically isolated from the second sheet of resistive material 20, and from the contacts 21, 22, by a body of dielectric material 77 (in the form of a layer, sheet, or thin film). The third terminal may be described as a control terminal, and is positioned close to the second sheet (e.g. on the dielectric layer 77) so that the resistivity of the resistor (e.g. if the resistive material is IGZO, or some other material having a resistance affected by electric field) can be controlled by applying a control voltage, or potential, to the third terminal. Thus, an electric field applied from (generated around) the third terminal affects the resistance of the conductive path between the contacts 21, 22. In this example, the third terminal is placed above the dielectric layer 77 and between the lateral resistor terminals 21, 21, but in alternative resistors may be located differently (e.g. underneath a substrate supporting the second sheet 20. The third terminal does not have to induce a field in the whole length of the device. Thus, as shown in FIG. 16, the control terminal 23 is arranged over just a portion (a central portion) of the length of the second sheet between the contacts 21, 22, and portions of the second sheet on either side of the central portion are not overlapped by the control terminal 23. The resistor in FIG. 16 can be thought of as akin to a highly depleted FET, albeit one where the "gate" terminal does not extend along the whole channel. In alternative implementations, however, the control terminal may extend across at least the full span/length of resistor material between the contacts 21, 22. The inventors have observed that the resistivity of IGZO, for example, when configured as a resistor may be controlled by applying an electric field. The effect is believed to result from the equivalence of a doped IGZO resistor to a highly depleted FET; by applying an electric field the density of charge carriers (electrons) is changed, thereby affecting the effective resistivity.

Figure 17:
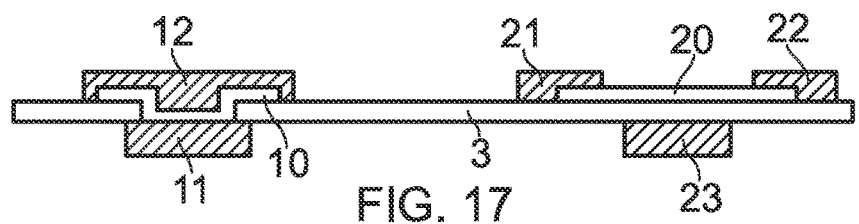
FIG. 17 illustrates a circuit in which a vertical resistor and voltage controlled lateral resistor are integrated.

Referring now to FIG. 17, this shows a circuit embodying the invention and in which a vertical resistor and voltage controlled horizontal resistor are integrated. Here, the control terminal 23 is underneath the second sheet 20, separated from it by the insulative substrate 3. The first terminal 11 of the first resistor and the control terminal of the second resistor may be formed at the same time, e.g. by depositing a sheet of conductive material and then patterning it (they are both on the underside of the substrate. The first resistive sheet 10 and second resistive sheet 20 may also be formed at the same time as one another, again by depositing a single sheet (or resistive material) and then patterning it. Lastly, the second contact 12 of the first resistor and the contacts 21, 22 of the second resistor may be formed at the same time as each other, again by depositing a single conductive sheet and then patterning it. The first sheet is formed partly inside a window through the substrate, to the lower contact 11, but also overlaps portions of the upper surface of the substrate around the window.

Figure 18:
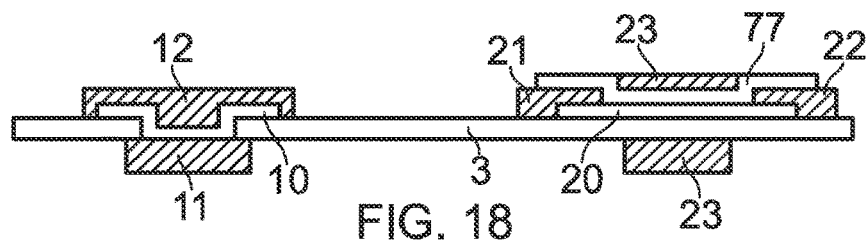
FIG. 18 illustrates a circuit integrating a vertical resistor and voltage controlled resistor with two control terminals.

Referring now to FIG. 18, this shows a circuit similar to that in FIG. 17, but here the voltage controlled horizontal resistor has two control terminals 23, one underneath the second sheet 20, formed on an underside of the substrate 3, and another formed above the second sheet, on a dielectric layer 77. Providing two control terminals can enable a greater degree of control or resistance to be achieved with the same maximum control voltage, than with a single control terminal.

Figure 19:
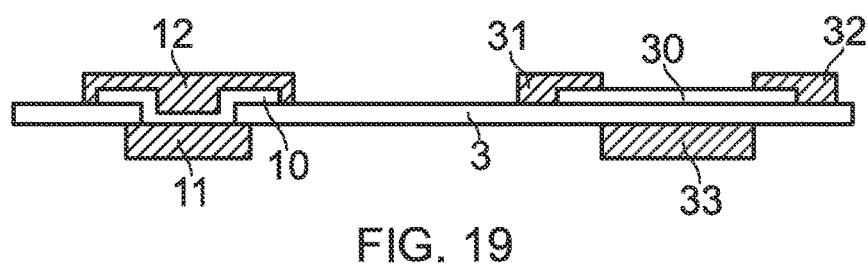
FIG. 19 illustrates a circuit integrating a vertical resistor and thin film transistor.

Referring now to FIG. 19, this shows a circuit embodying the invention and in which a vertical resistor and a bottom gate thin film transistor are integrated, The TFT comprises a gate 33, formed on an underside of the substrate 3 (e.g. at the same time as the bottom contact 11 of the first resistor), a body (e.g. thin film) of semiconductive material 30, providing a controllable channel, and source and drain terminals 31, 32, which may be formed at the same time as the upper contact 12. In this embodiment, the gate terminal 33 extends so as to cover at least the full span between the two topside contacts 31, 32.

The invention claimed is:
1. A thin-film integrated circuit (IC) comprising:
a first resistor, a second resistor, and a substrate arranged to support the first and second resistors, the substrate comprising an electrically insulating layer having a nominal underside and a nominal upper side, the first resistor comprising:
a first sheet of resistive material; and
a first pair of conductive contacts, each arranged in electrical contact with the first sheet, and arranged such that a shortest resistive path in the first sheet between the first pair of contacts passes through the first sheet and has a length equal to a thickness of the first sheet, and the second resistor comprising:
a second sheet of resistive material; and
a second pair of conductive contacts, each arranged in electrical contact with the second sheet, and arranged such that a shortest resistive path in the second sheet between the second pair of contacts passes along at least a portion of a length of the second sheet,
wherein at least a portion of said second sheet is formed directly on said upper side, and
wherein a first contact of the first pair is formed on said underside, the electrically insulating layer comprises a window extending from the upper side through to the underside and enabling electrical contact of the first sheet to at least a portion of an upper surface of the first contact of the first pair, at least part of the first sheet being formed inside the window and in contact with the first contact, and a second contact of the first pair of contacts being formed at least partially over an upper surface of the first sheet.

2. The thin-film IC in accordance with claim 1, wherein the first sheet comprises a first quantity of a first resistive material and the second sheet comprises a second quantity of said first resistive material.

3. The thin-film IC in accordance with claim 1, wherein each of the first and second sheets has the same substantially uniform thickness.

4. The thin-film IC in accordance with claim 1, wherein the first and second sheets are respective portions of a single sheet formed and then patterned during manufacture of the thin-film IC.

5. The thin-film IC in accordance with claim 1, wherein a first contact of the first pair is arranged in contact with at least a portion of a first surface of the first sheet, and a second contact of the first pair is arranged in contact with at least a portion of a second surface of the first sheet.

6. The thin-film IC in accordance with claim 1, wherein the first sheet overlaps at least a portion of the nominal upper side surrounding said window.

7. The thin-film IC in accordance with claim 1, wherein the second contact of the first pair covers a portion, but not all, of the upper surface of the first sheet.

8. The thin-film IC in accordance with claim 1, wherein the second contact of the first pair covers the entire upper surface of the first sheet.

9. The thin-film IC in accordance with claim 8, wherein the second contact of the first pair extends beyond at least one edge of the first sheet so as to cover, and be in direct contact with, at least a portion of said upper side.

10. The thin-film IC in accordance with claim 1, wherein a first contact of the first pair is formed on said upper side.

11. The thin-film IC in accordance with claim 10, wherein said first sheet is formed over the first contact of the first pair and covers a portion, but not all, of the first contact of the first pair, or wherein said first sheet is formed over the first contact of the first pair and entirely covers the first contact of the first pair.

12. The thin-film IC in accordance with claim 11, wherein the first sheet extends beyond at least one edge of the first contact of the first pair so as to cover, and be in direct contact with, a portion of said upper side.

13. The thin-film IC in accordance with claim 11, wherein a second contact of the first pair is formed over the first sheet so as to cover at least a portion of the first sheet.

14. The thin-film IC in accordance with claim 13, wherein the second contact of the first pair covers a portion, but not all, of the first sheet, or wherein the second contact of the first pair entirely covers the first sheet.

15. The thin-film IC in accordance with claim 14, wherein the second contact of the first pair extends beyond at least one edge of the first sheet so as to cover, and be in direct contact with, a portion of said upper side.

16. The thin-film IC in accordance with claim 1, wherein a first contact of the second pair is formed at least partially over the second sheet so as to cover a first portion of the second sheet, or wherein the first contact of the second pair extends beyond an edge of the second sheet so as to cover, and be in direct contact with, a portion of said upper side.

17. The thin-film IC in accordance with claim 1, wherein a second contact of the second pair is formed at least partially over the second sheet so as to cover a second portion of the second sheet, optionally wherein the second contact of the second pair extends beyond an edge of the second sheet so as to cover, and be in direct contact with, a portion of said upper side.

18. The thin-film IC in accordance with claim 1, wherein a first contact of the second pair is formed directly on said upper side.

19. The thin-film IC in accordance with claim 18, wherein said second sheet is formed over the first contact of the second pair so as to at least partially cover the first contact of the second pair and to cover and be in direct contact with a portion of the upper side adjacent the first contact of the second pair.

20. The thin-film IC in accordance with claim 18, wherein a second contact of the second pair is formed directly on said upper surface, and said second sheet is formed over the second contact of the second pair so as to at least partially cover the second contact of the second pair.

21. The thin-film IC in accordance with claim 19, wherein a second contact of the second pair is formed at least partially over the second sheet so as to cover a second portion of the second sheet, optionally wherein the second contact of the second pair extends beyond an edge of the second sheet so as to cover, and be in direct contact with, a portion of said upper side.

22. The thin-film IC in accordance with claim 1, further comprising at least one of: a transistor; a voltage divider; a biasing network; and an oscillator circuit, and wherein the second resistor is arranged as one of: a load resistor between a terminal of said transistor and a voltage rail; a resistor of the voltage divider or biasing network; and a component of the oscillator circuit.

23. The thin-film IC in accordance with claim 1, further comprising at least one of: a logic gate; and an oscillator circuit, and the first resistor is arranged as one of: a component of the logic gate; and a component of the oscillator circuit.

24. A method of manufacturing a thin-film integrated circuit (IC) comprising a first resistor, a second resistor, and a substrate arranged to support the first and second resistors, the substrate comprising an electrically insulating layer having a nominal underside and a nominal upper side, the method comprising:

forming a first sheet of resistive material;
forming a first pair of conductive contacts, each arranged in electrical contact with the first sheet, and arranged such that a shortest resistive path in the first sheet between the first pair of contacts passes through the first sheet and has a length equal to a thickness of the first sheet;
forming at least a portion of a second sheet of resistive material directly on said upper side; and
forming a second pair of conductive contacts, each arranged in electrical contact with the second sheet, and arranged such that a shortest resistive path in the second sheet between the second pair of contacts passes along at least a portion of a length of the second sheet, whereby the first sheet and first pair of contacts form the first resistor and the second sheet and second pair of contacts form the second resistor,
wherein the method further comprises:
forming a first contact of the first pair on said underside of the electrically insulating layer;
forming a window extending from the upper side of the electrically insulating layer through to the underside of the electrically insulating layer;
forming a single sheet of resistive material over the first contact of the first pair;
patterning said single sheet to form said first and second sheets, wherein the window enables electrical contact of the first sheet to at least a portion of an upper surface of the first contact of the first pair, at least part of the first sheet being formed inside the window and in contact with the first contact and wherein the first sheet overlaps at least a portion of the nominal upper side of the electrically insulating layer surrounding said window;
forming a single sheet of conductive material over the first and second sheets; and
patterning the single sheet of conductive material to form a second contact of the first pair.

25. The method in accordance with claim 24, further comprising processing or doping at least a portion of at least one of the first and second sheets to alter its sheet resistance.

* * * * *